(12) United States Patent  (10) Patent No.: US 7,729,072 B2
Dahle et al.  (45) Date of Patent: Jun. 1, 2010

(54) OPEN WRITE-HEAD-CABLE TEST METHOD AND DETECTOR

(75) Inventors: Jacob L. Dahle, Tucson, AZ (US); Larry L. Tretter, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 552 days.

(21) Appl. No.: 11/753,377

(22) Filed: May 24, 2007

(65) Prior Publication Data

US 2008/0290863 A1 Nov. 27, 2008

(51) Int. Cl.
*G11B 5/09* (2006.01)
(52) U.S. Cl. .............................. 360/46; 360/31; 324/210
(58) Field of Classification Search ........................ None
See application file for complete search history.

(56) References Cited

U.S. PATENT DOCUMENTS

| | | | | |
|---|---|---|---|---|
| 5,087,884 A | * | 2/1992 | Brannon ..................... | 324/523 |
| 6,060,887 A | * | 5/2000 | Nakamura et al. .......... | 324/546 |
| 6,081,396 A | * | 6/2000 | Ryat ............................ | 360/46 |
| 6,101,052 A | * | 8/2000 | Gooding et al. .............. | 360/46 |
| 6,424,475 B1 | * | 7/2002 | Bhandari et al. ............. | 360/31 |
| 6,489,779 B1 | * | 12/2002 | Tucker ....................... | 324/522 |
| 6,687,064 B1 | * | 2/2004 | Jiang et al. .................... | 360/31 |
| 6,952,316 B2 | * | 10/2005 | Tretter ......................... | 360/31 |
| 2001/0010602 A1 | * | 8/2001 | Takahashi .................... | 360/25 |

* cited by examiner

*Primary Examiner*—Jason C Olson

(57) ABSTRACT

A storage drive implements a method for operating the storage drive between a plurality of operational modes. For a test mode of the storage drive, a write current driver circuit and a test current sensor are electrically connected to the write head, wherein the test current sensor generates a sense signal indicative of a degree of a flow of a test current through the write head to thereby facilitate a detection of any presence of an open write condition of the storage drive (i.e., any impedance condition impeding a flow of a write current through the write head). For a write mode of the storage drive, the write current driver circuit is electrically connected to the write head and the test current sensor is electrically disconnected from the write head, wherein the write head records data on a magnetic media based on a flow of the write current through the write head.

23 Claims, 19 Drawing Sheets

US 7,729,072 B2

OPEN WRITE-HEAD-CABLE TEST METHOD AND DETECTOR

FIELD OF THE INVENTION

The present invention generally relates to a series of self-testing by a storage drive (e.g., a disk drive or a tape drive) to determine an operational capacity of a write head of the storage drive to record data on a magnetic media (e.g., a magnetic disk or a magnetic tape). The present invention specifically relates to a self-testing by a storage drive for any presence of an open write condition of the storage drive (i.e., any impedance condition of the storage drive impeding a flow of a write current through a write head.)

BACKGROUND OF THE INVENTION

Magnetic tape provides a means for physically storing data. As an archival medium, tape often comprises the only copy of the data. The tape is typically made as thin as practically possible to maximize the length of a tape stored on a tape reel, and thereby maximize the amount of data that can be stored on the tape contained in a single cartridge. A tape drive is used to store and retrieve data with respect to the magnetic tape. An example of a tape drive is the IBM TotalStorage Enterprise Tape Drive 3592 manufactured by IBM Corporation. Tape drives are typically used in combination with an automated data storage library. For example, the IBM Total-Storage Enterprise Tape Library 3494 manufactured by IBM Corporation is an automated data storage library that may include one or more tape drives and data storage media for storing data with respect to the tape drives.

FIG. 1 illustrates an exemplary configuration of a known write mechanism of a tape drive employing a write current driver ("WCD") circuit 50 having four (4) write current drivers in the form of an H-configuration of electronic switches S1-S4, which are electrically disconnected from a write head 30. Under normal write conditions, opened electronic switches S1 and S4 can be closed as shown in FIG. 2 to electrically connect write current driver circuit 50 to Write head 30 via a drive card 40 and a pair of cables C1 and C2 whereby a write current $I_W$ flows from a power supply 60 through write head 30 to a power return 61 in a first direction as indicated by the arrows. Similarly, opened electronic switches S2 and S3 can be closed as shown in FIG. 3 to electrically connect write current driver circuit 50 to write head 30 via drive card 40 and cables C1 and C2 whereby write current $I_W$ flows from power supply 60 through write head 30 to power return 61 in a second opposing direction as indicated by the arrows.

Under an open write condition, the write current $I_W$ will not flow through write head 30 upon a closing of electronic switches S1 and S4 or a closing of electronic switches S2 and S3. For example, as shown in FIG. 4, an open condition OC1 of write head 30, an open condition OC2 of cable C1 and/or an open condition OC3 of drive card 40 will impede a flow of write current $I_W$ from power supply 60 through write head 30 to power return 61. Consequently, the storage industry is constantly striving to improve upon techniques for detecting a presence of an open write condition of a storage drive.

SUMMARY OF THE INVENTION

Various embodiments of the present invention provide a new and unique technique for detecting any presence of an open write condition of a storage drive (i.e., any impedance condition of the storage drive impeding a flow of a write current through a write head.)

A first form of the present invention is a method for operating a storage drive (e.g., a disk drive or a tape drive) between a plurality of operational modes. For a test mode of the storage drive, a write current driver circuit and a test current sensor are electrically connected to a write head, wherein the test current sensor generates a sense signal indicative of a degree of a flow of a test current through the write head. For a write mode of the storage drive, the write current driver circuit is electrically connected to the write head and the test current sensor is electrically disconnected from the write bead, wherein the write head records data on a magnetic media (e.g., a magnetic disk or a magnetic tape) based on a flow of a write current through the write head.

A second form of the present invention is a storage drive (e.g., a disk drive or a tape drive) having a plurality of operational modes. The storage drive comprises a write head, a write current driver circuit and a test current sensor. For a test mode of the storage drive, a write current driver circuit and a test current sensor are electrically connected to a write head, wherein the test current sensor generates a sense signal indicative of a degree of a flow of a test current through the write head. For a write mode of the storage drive, the write current driver circuit is electrically connected to the write head and the test current sensor is electrically disconnected from the write head, wherein the write head records data on a magnetic media (e.g., a magnetic disk or a magnetic tape) based on a flow of a write current through the write head.

A third form of the present invention is a storage system (e.g., a disk system or a tape system) having a plurality of operational modes. The storage system comprises a write controller, a write head, a write current driver circuit and a test current sensor. For a test mode of the storage system, a write controller electrically connects the write current driver circuit and the test current sensor to the write head, wherein the test current sensor generates a sense signal indicative of a degree of a flow of a test current through the write head. For a write mode of the storage system, the write controller electrically connects the write current driver circuit to the write head and electrically disconnects the test current sensor from the write head, wherein the write head records data on a magnetic media (e.g., a magnetic disk or a magnetic tape) based on a flow of a write current through the write head.

The aforementioned forms and additional forms as well as objects and advantages of the present invention will become further apparent from the following detailed description of the various embodiments of the present invention read in conjunction with the accompanying drawings. The detailed description and drawings are merely illustrative of the present invention rather than limiting, the scope of the present invention being defined by the appended claims and equivalents thereof.

DETAILED DESCRIPTION

Figure 1:
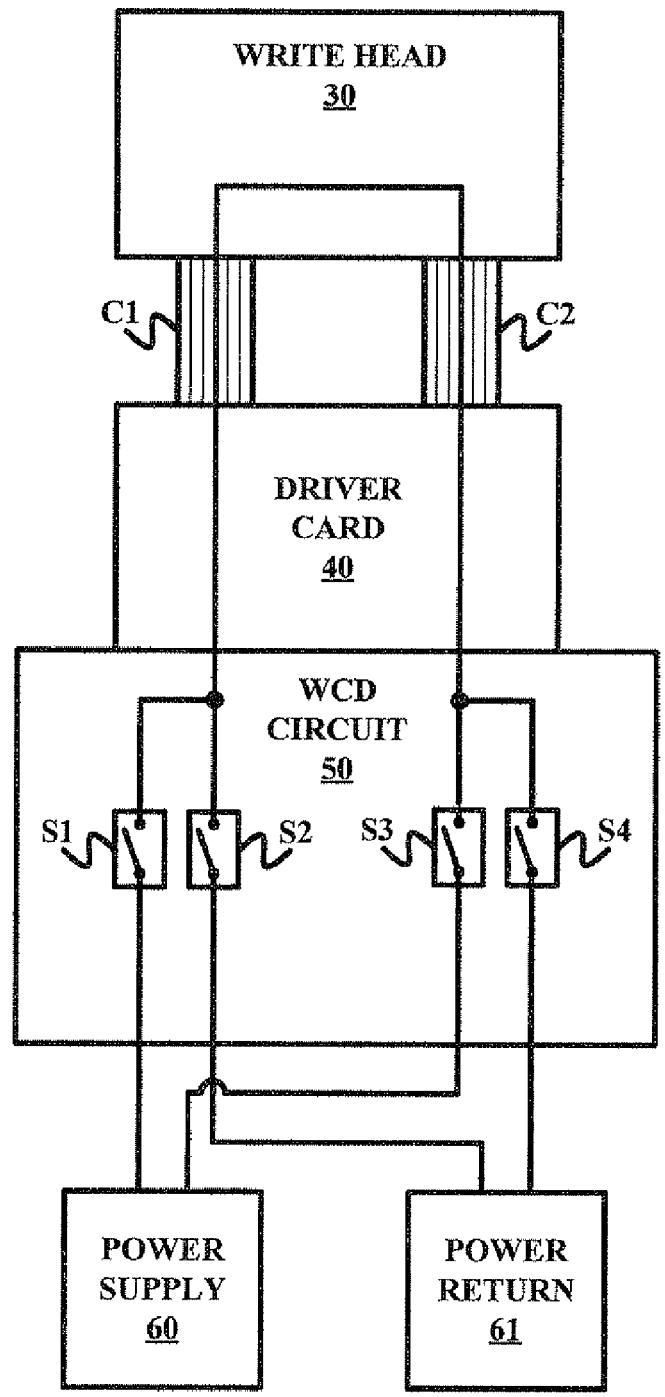
FIGS. 1-4 illustrates a block diagram of a H configuration write current driver circuit as known in the art.
Figure 2:
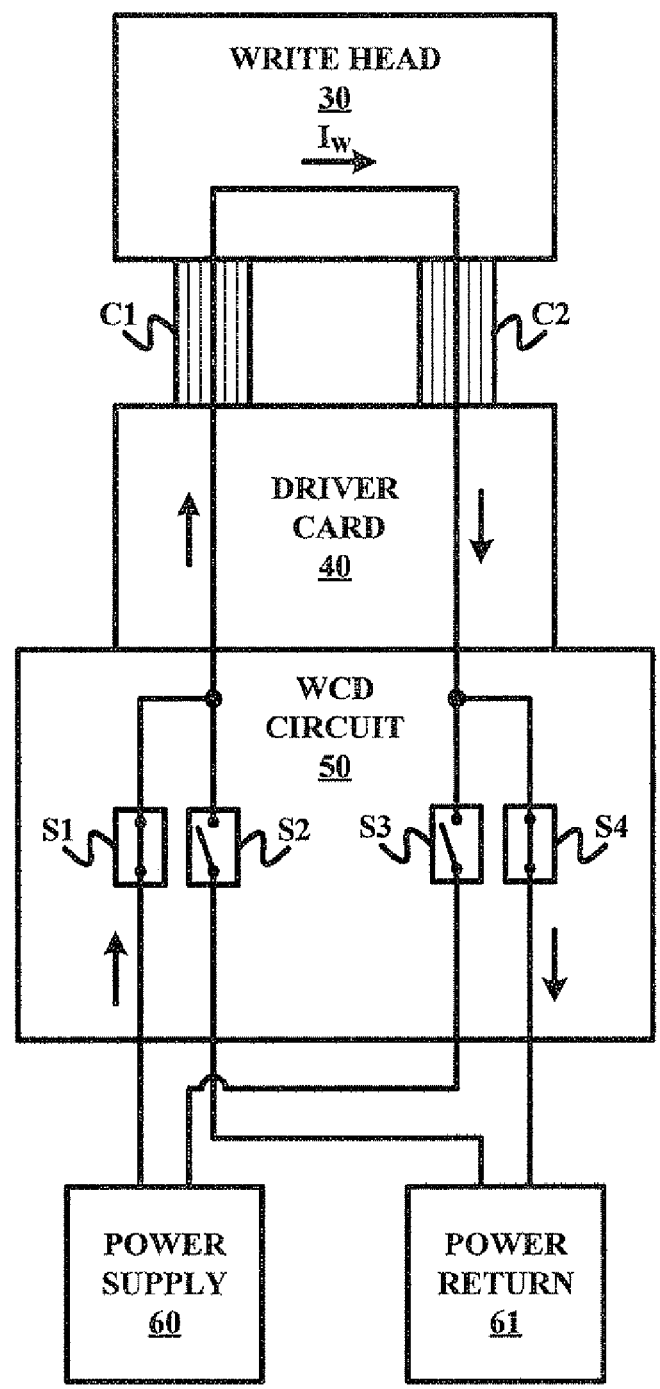
Figure 3:
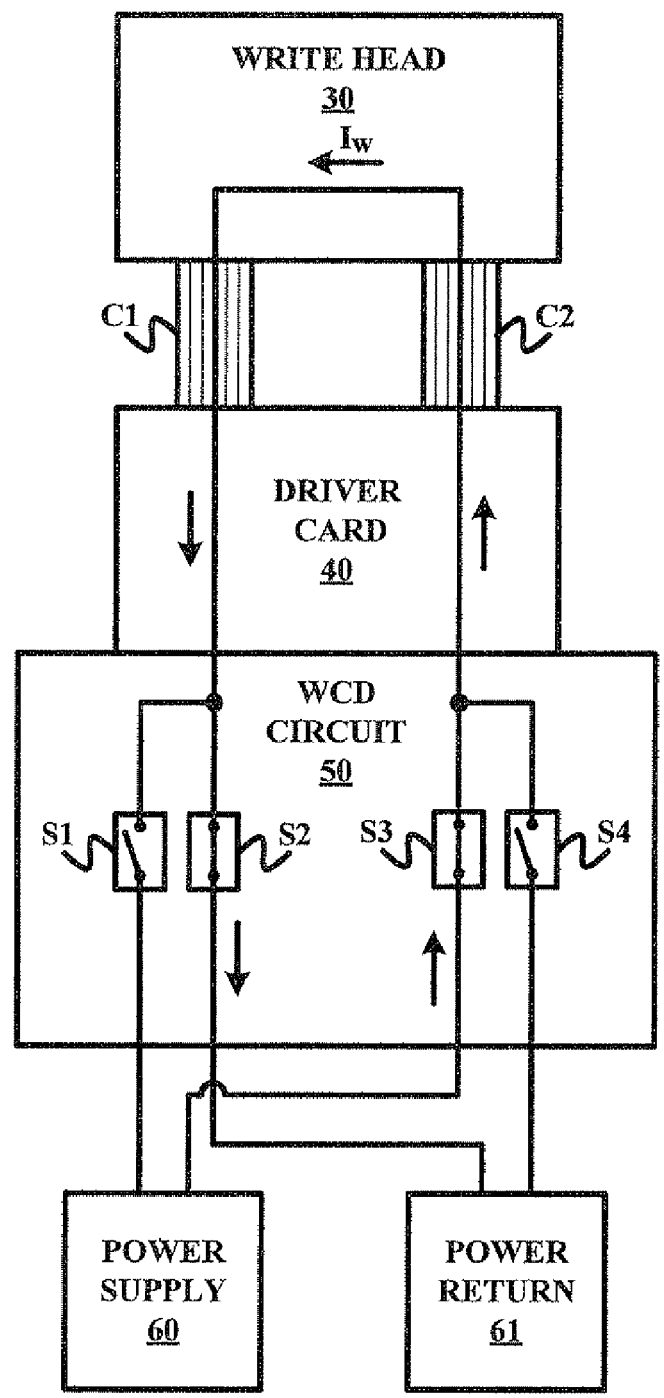
Figure 4:
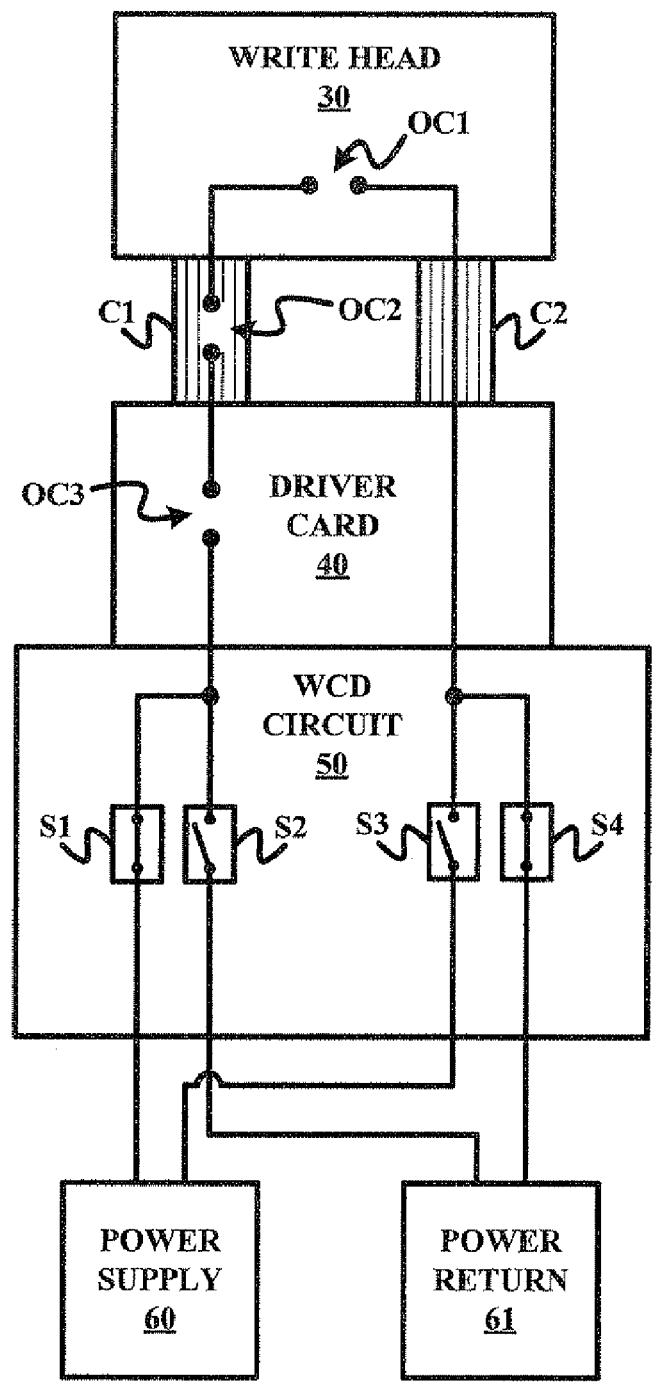
Figure 5:
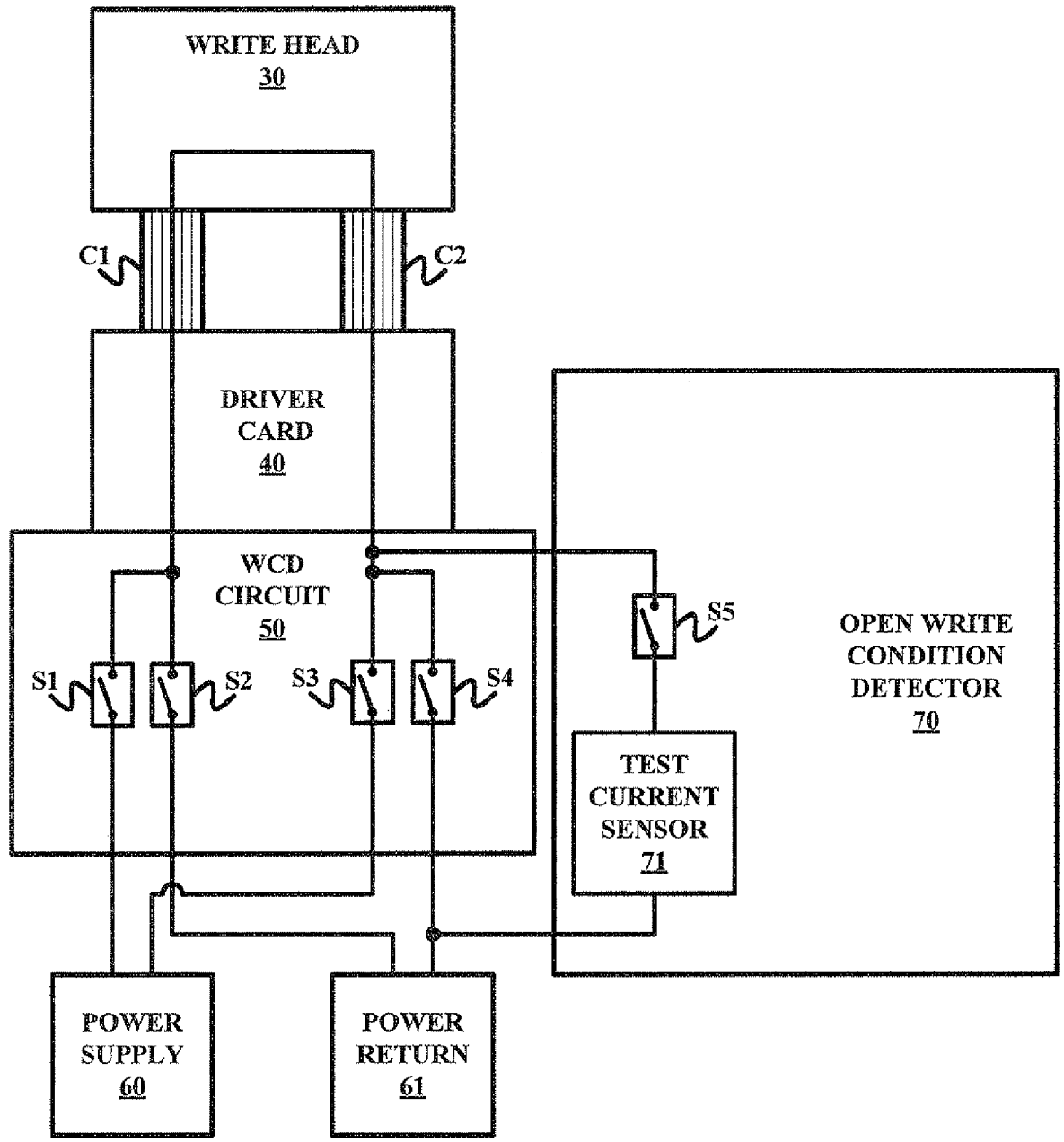
FIGS. 5 and 8-11 illustrates a block diagram of one embodiment of a H configuration write current driver circuit having an integrated open write condition detector in accordance with the present invention.

FIG. 5 illustrates an integration of an open write condition detector 70 into the storage drive of FIG. 1. Detector 70 employs a test current driver in the form of an electronic switch S5 and a test current sensor 71 to detect a presence of any open write condition of the storage drive. With this integration, the storage drive operates between an idle mode, a test mode and a write mode.

Figure 6:
FIG. 6 illustrates a table listing various operating modes of the H configuration write current driver circuit having an integrated open write condition detector as illustrated in FIGS. 5 and 8-11.
Figure 8:
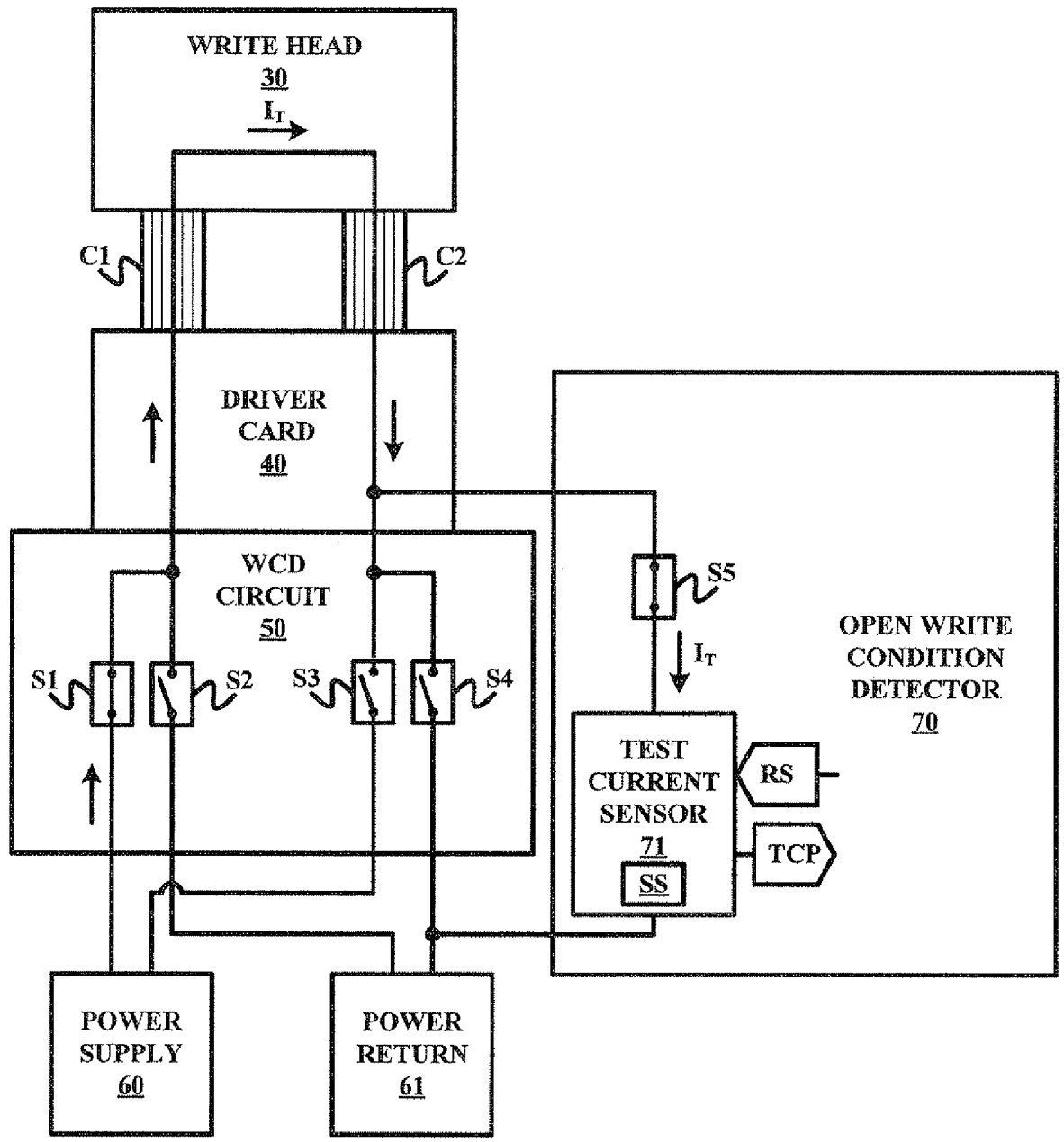
Figure 9:
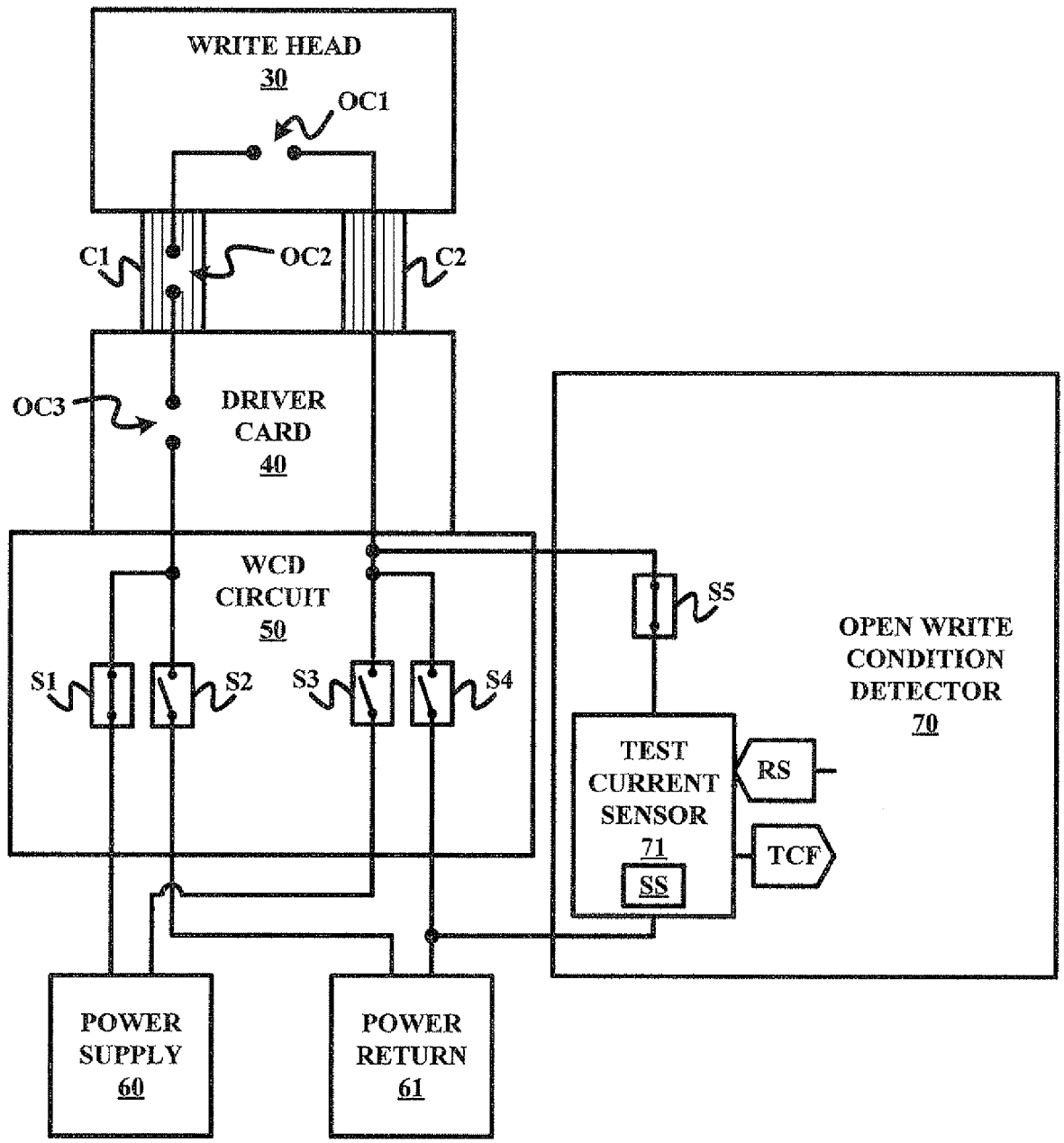
Figure 10:
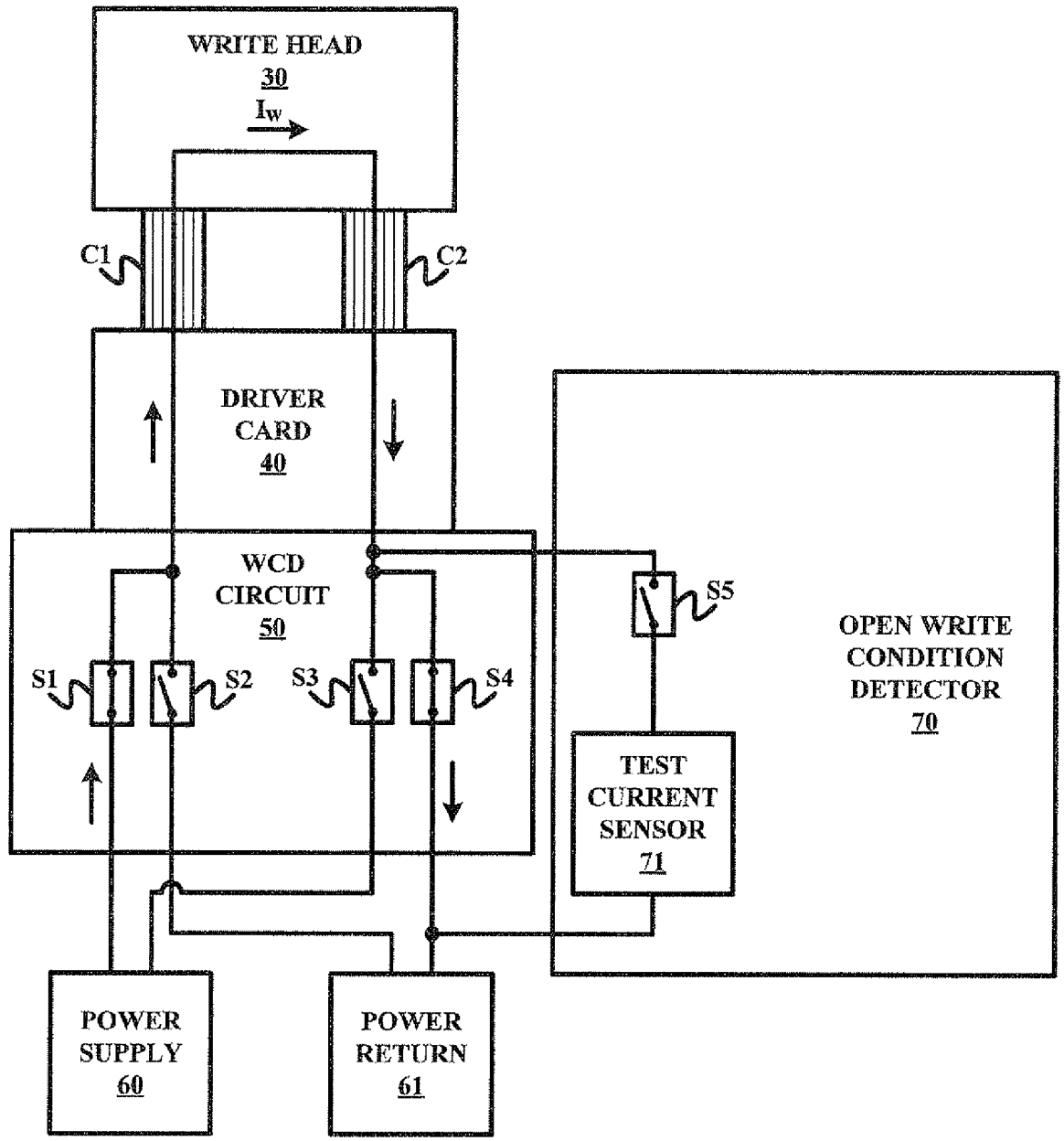
Figure 11:
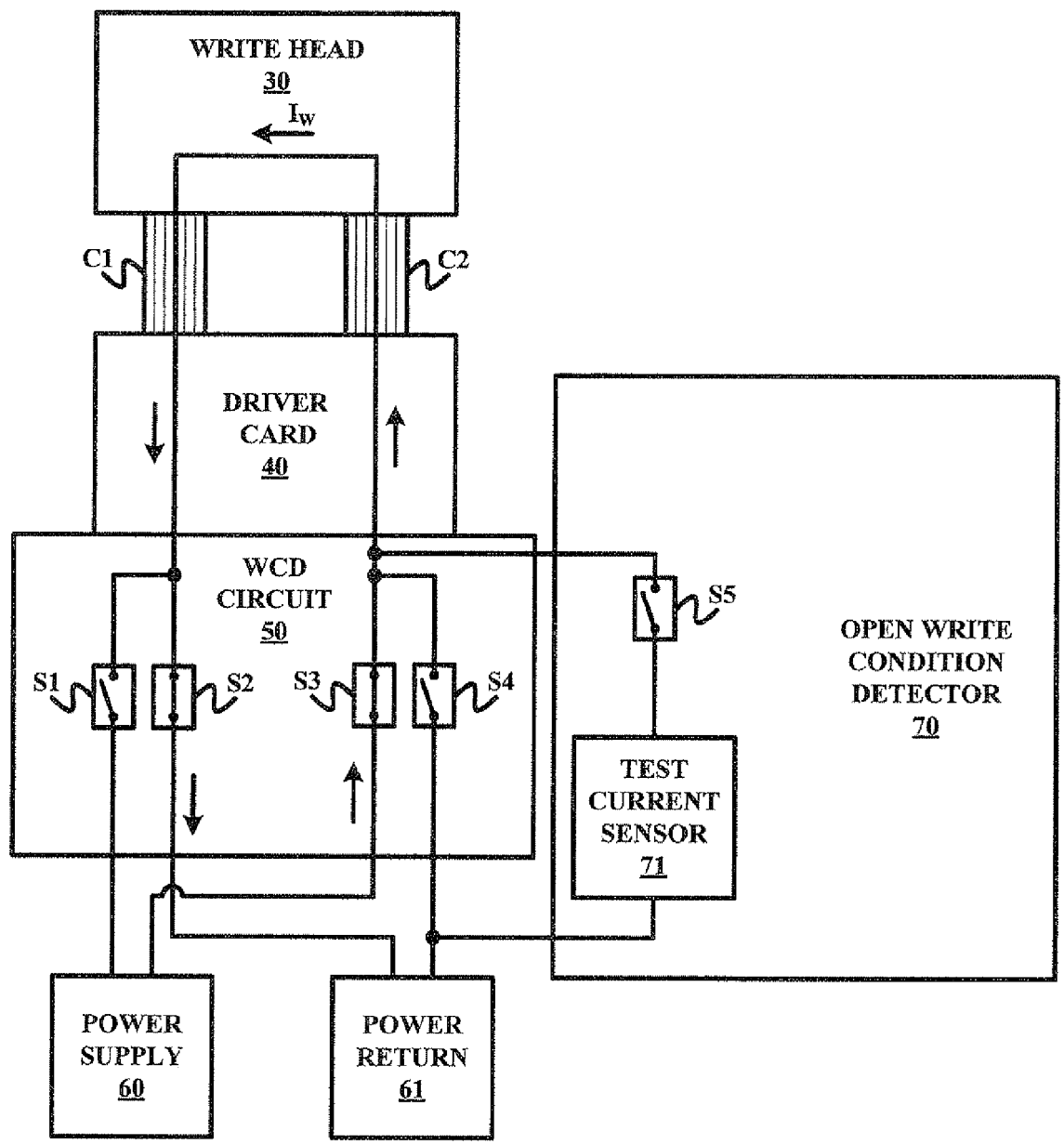

Specifically, referring to an operational mode table 80 shown in FIG. 6, the idle mode of the storage drive encompasses electronic switches S1-S5 being in an open state whereby write current driver circuit 50 and test current sensor 70 are electrically disconnected from write head 30 as shown in FIG. 5. The test mode of the storage drive encompasses electronic switches S1 and S5 being in a closed state and electronic switches S2-S4 being in an open state whereby write current driver circuit 50 and test current sensor 70 are electrically connected to write head 30 as shown in FIGS. 8 and 9. The write mode of the storage drive includes electronic switch S5 being in an open state with electronic switches S1 and S4 being in a closed state and electronic switches S2 and S3 being in an open state as shown in FIG. 10, or with electronic switches S1 and S4 being in an open state and electronic switches S2 and S3 being in a closed state as shown in FIG. 11.

Figure 7:
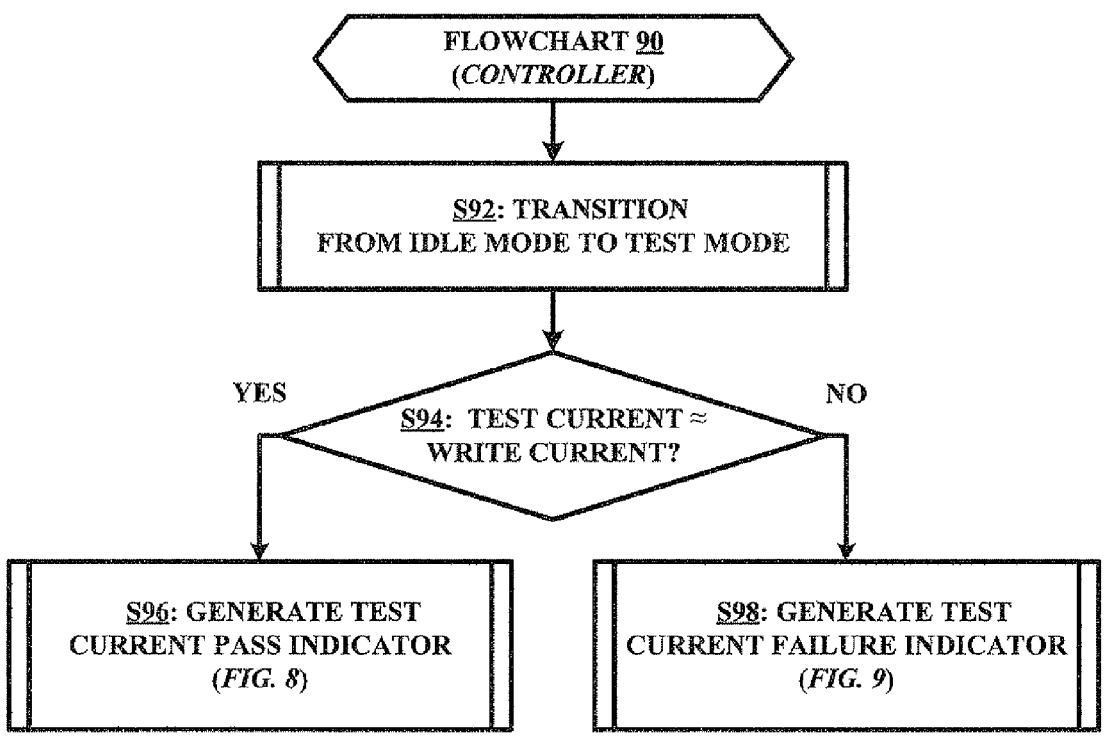
FIG. 7 illustrates a flowchart representative of one embodiment of an open write condition detection method in accordance with the present invention.

For the test mode, a flowchart 90 shown in FIG. 7 is representative of an open write condition detection method of the present invention. Specifically, a stage S92 of flowchart 90 encompasses a controller (not shown) providing control signals (e.g., logic signals) to electronic switches S1-S5 to close switches S1 and S5 and maintain switches S2-S4 in an open state as shown in FIGS. 8 and 9. During a stage S94 of flowchart 90, test current sensor 71 generates a sensing signal SS indicative of a degree of flow of a test current $I_T$ through write head 30, and compares sensing signal SS to a reference signal RS representative of a flow of write current $I_W$ through write head 30 under normal write conditions. If the comparison of sensing signal SS and reference signal RS indicates the flow of test current $I_T$ through write head 30 is equivalent to the flow of write current $I_W$ through write head 30 under a normal write condition (i.e., test current $I_T \approx$ write current $I_W$), then test current sensor 71 generates a test current pass indicator TCP as shown in FIG. 8 that is communicated to the controller for purposes of informing the controller of the normal write condition of the storage drive. As a result, the controller understands that it can operate the storage drive in the write mode as shown in FIGS. 10 and 11.

Conversely, if the comparison of sensing signal SS and reference signal RS indicates the flow of test current $I_T$ through write head 30 is unequivalent to the flow of write current $I_W$ through write head 30 under a normal write condition (i.e., test current $I_T$=0 or is significantly less than write current $I_W$), then test current sensor 71 generates a test current failure indicator TCF as shown in FIG. 9 that is communicated to the controller for purposes of informing the controller of the open write condition of the storage drive. As a result, the controller understands that it can not operate the storage drive in the write mode as shown in FIGS. 10 and 11.

In practice, there are no limitations or restrictions to the structural configurations of a write current driver circuit 50 and an open write condition detector 70 as shown in FIGS. 5 and 8-11 in implementing the open write condition detection method shown in FIG. 7. To further illustrate an understanding of the open write condition detection method, FIG. 12 illustrates an exemplary structural configuration of write current driver circuit 50 as a known voltage mode current driving device having a H configuration of a pair of NFETs M1 and M2 and a pair of PFETs M3 and M4 for selectively applying a voltage source $V_S$ to a DC series resistance/inductance load R6/L1 of write head 30 via driver card 40 represented by resistors R3-R5 and via cables C1 and C2.

Figure 12:
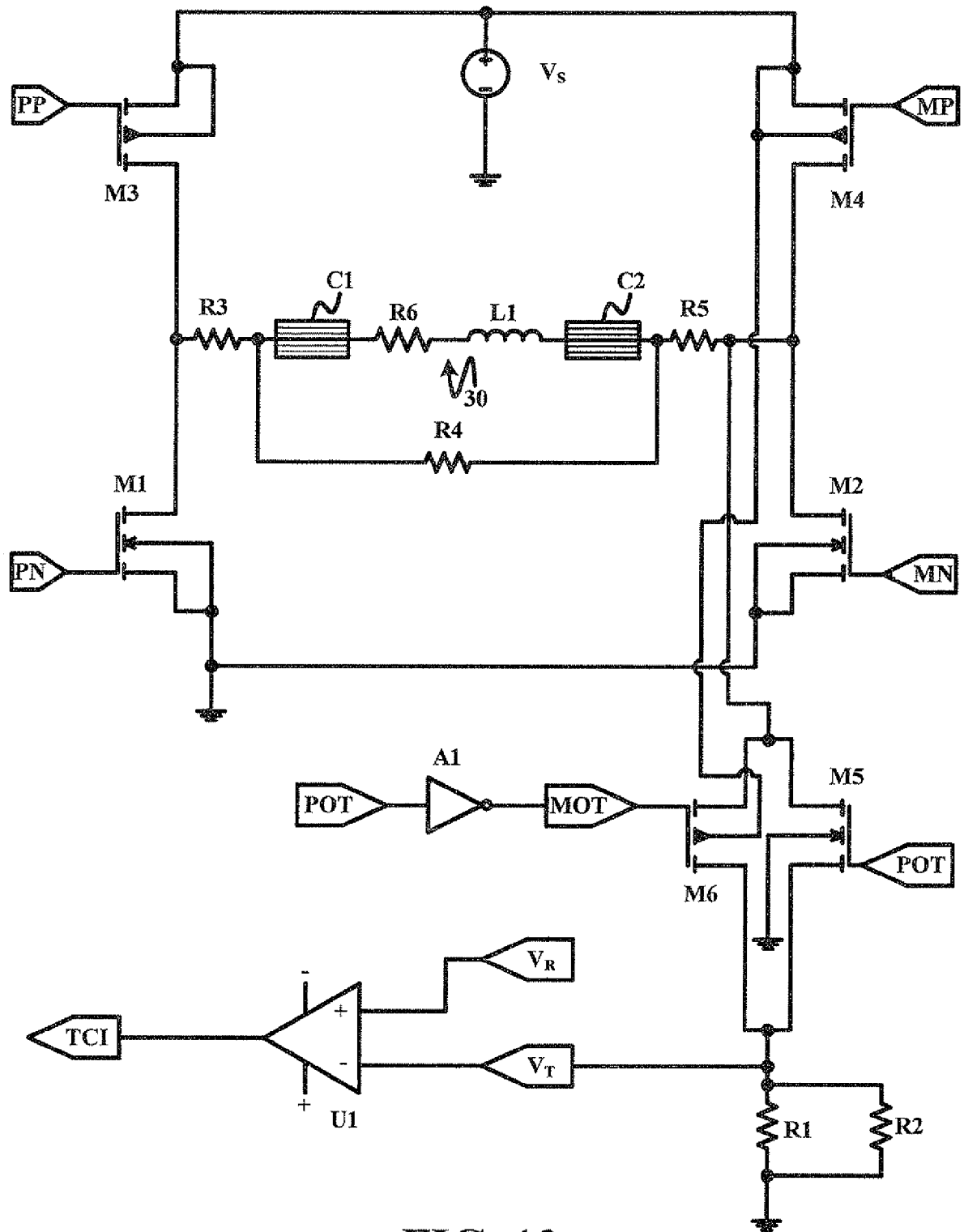
FIGS. 12 and 15-19 illustrates a schematic diagram of one embodiment of a H configuration voltage mode write current driver circuit having an integrated open write condition detector in accordance with the present invention.

Also shown in FIG. 12 is an exemplary structural configuration of open write condition detector 70 employing a pair of test current drivers in the form of a NFET M5 and a PFET M6, a voltage generator having a pair of resistors R1 and R2 and a voltage comparator U1. FETs M5 and M6 are electrically connected in parallel and are electrically connected in series with a parallel electrical connection of resistors R1 and R2 that generate a test voltage $V_T$ at an inverting input (−) of voltage comparator U1. A programmable reference voltage $V_R$ representative of a flow of write current $I_W$ through write head 30 is applied to a non-inverting input (+) of voltage comparator U1 whereby voltage comparator U1 generates a test current indicator TCI based on a comparison of test voltage $V_T$ to a reference voltage $V_R$.

Figures 13, 14:
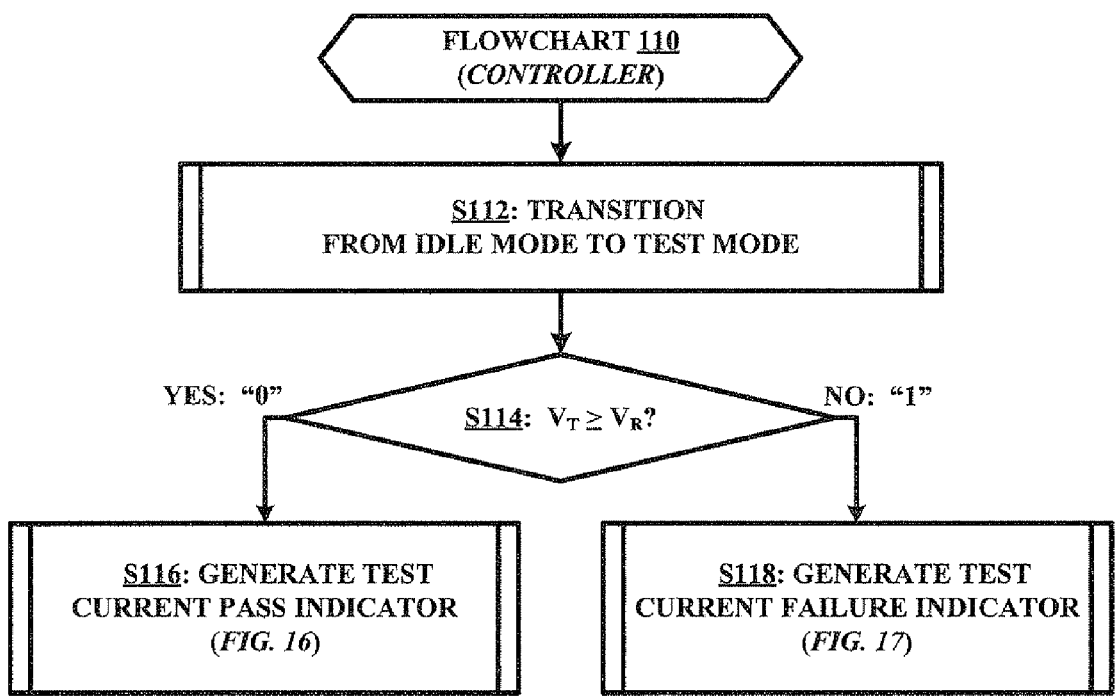
FIG. 13 illustrates a table listing various operating modes of the H configuration voltage mode write current driver circuit having an integrated open write condition detector as illustrated in FIGS. 12 and 15-19.
FIG. 14 illustrates a flowchart representative of a second embodiment of an open write condition detection method in accordance with the present invention.
Figure 15:
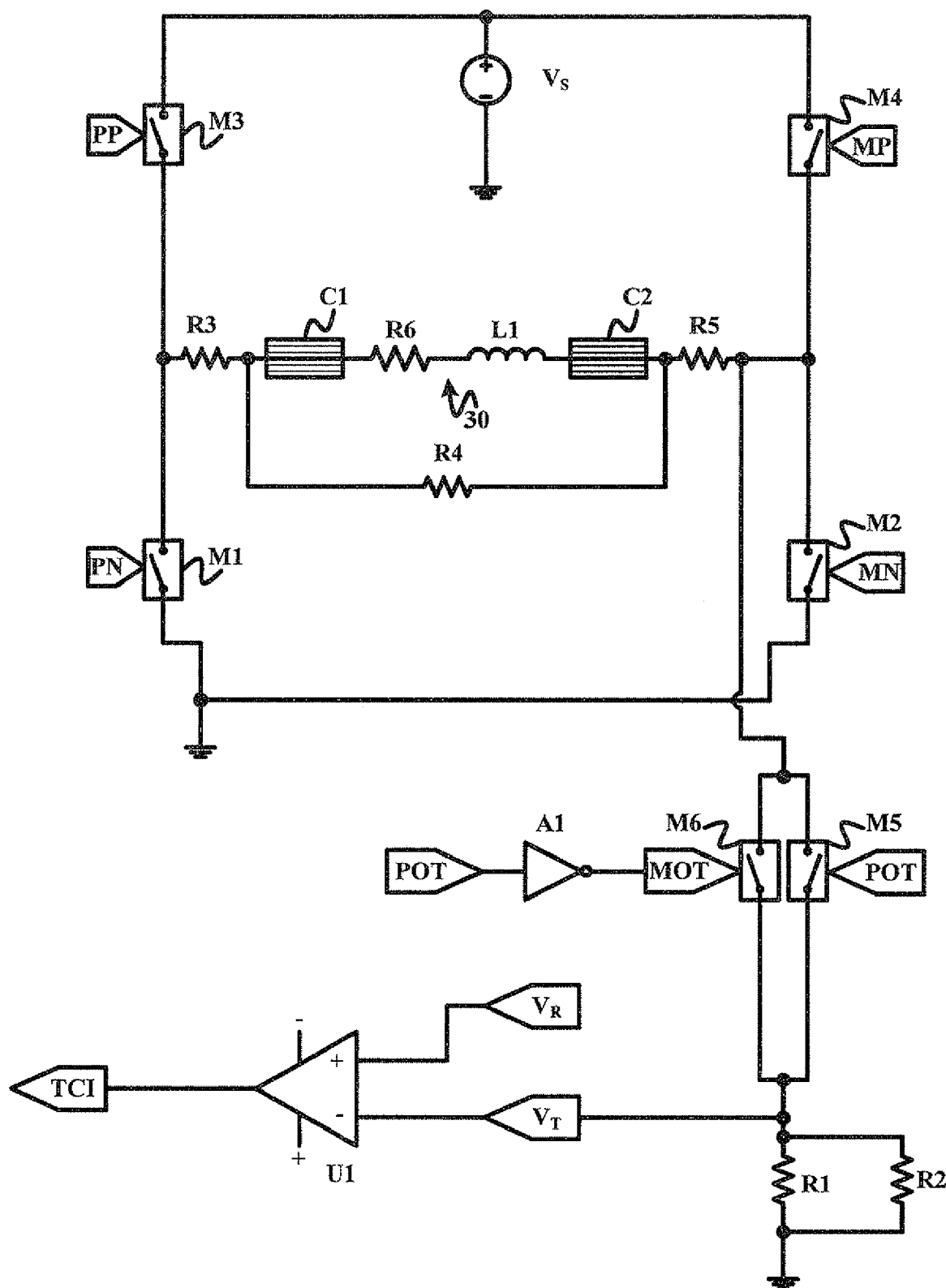

With this integration, the storage drive operates between an idle mode, a test mode and a write mode in accordance with an operational mode table 100 shown in FIG. 13. Specifically, the idle mode of the storage drive encompasses FETs M1-M6 being in non-conductive state ("NONC ST") whereby write current driver circuit 50 and test current sensor 70 are electrically disconnected from write head 30 as shown in FIG. 15. This is accomplished by an application of a disable logic level of gate signals PN, MN, PP, MP, POT and MOT to the respective gates of FETs M1-M6.

Figure 16:
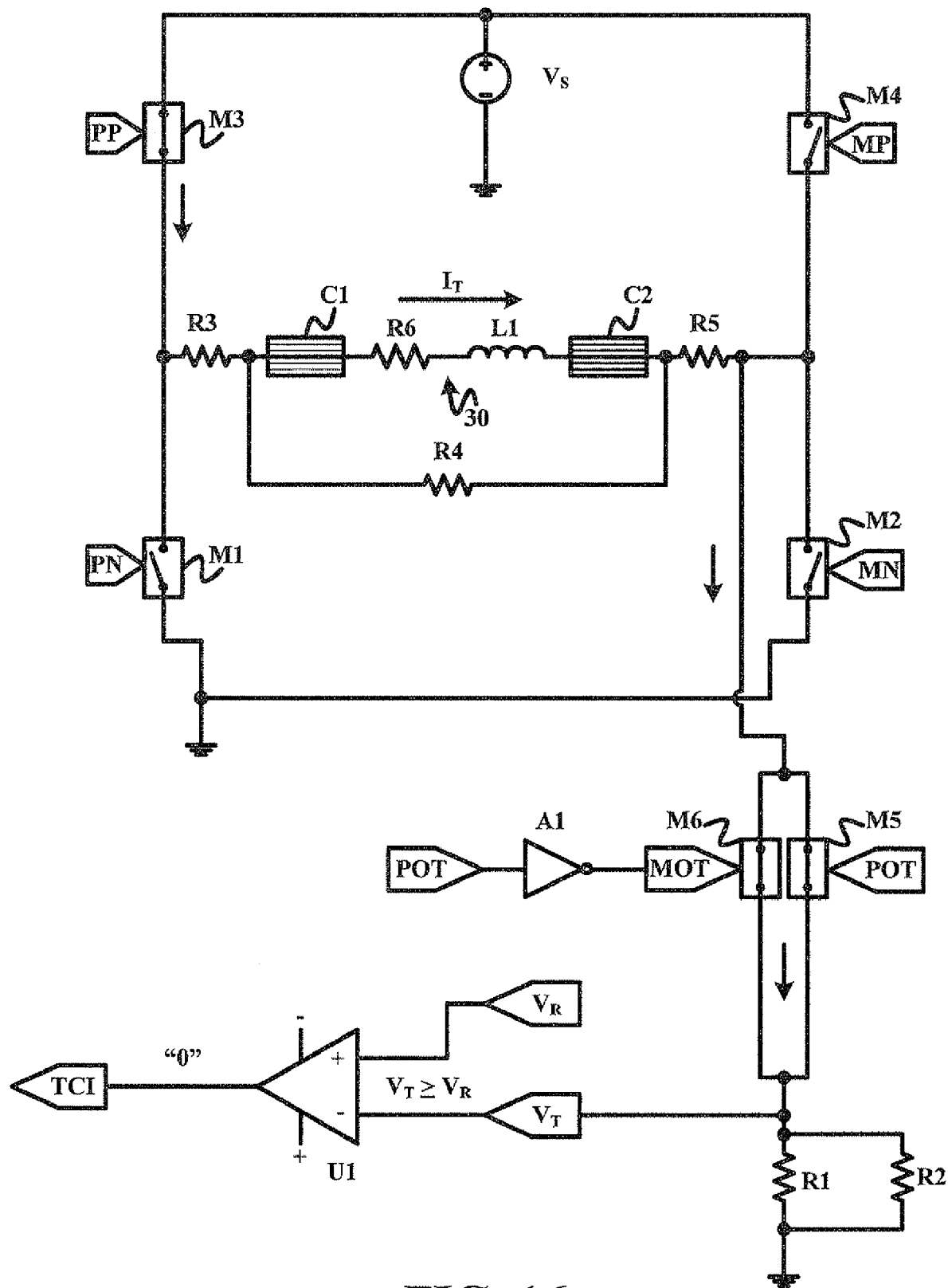
Figure 17:
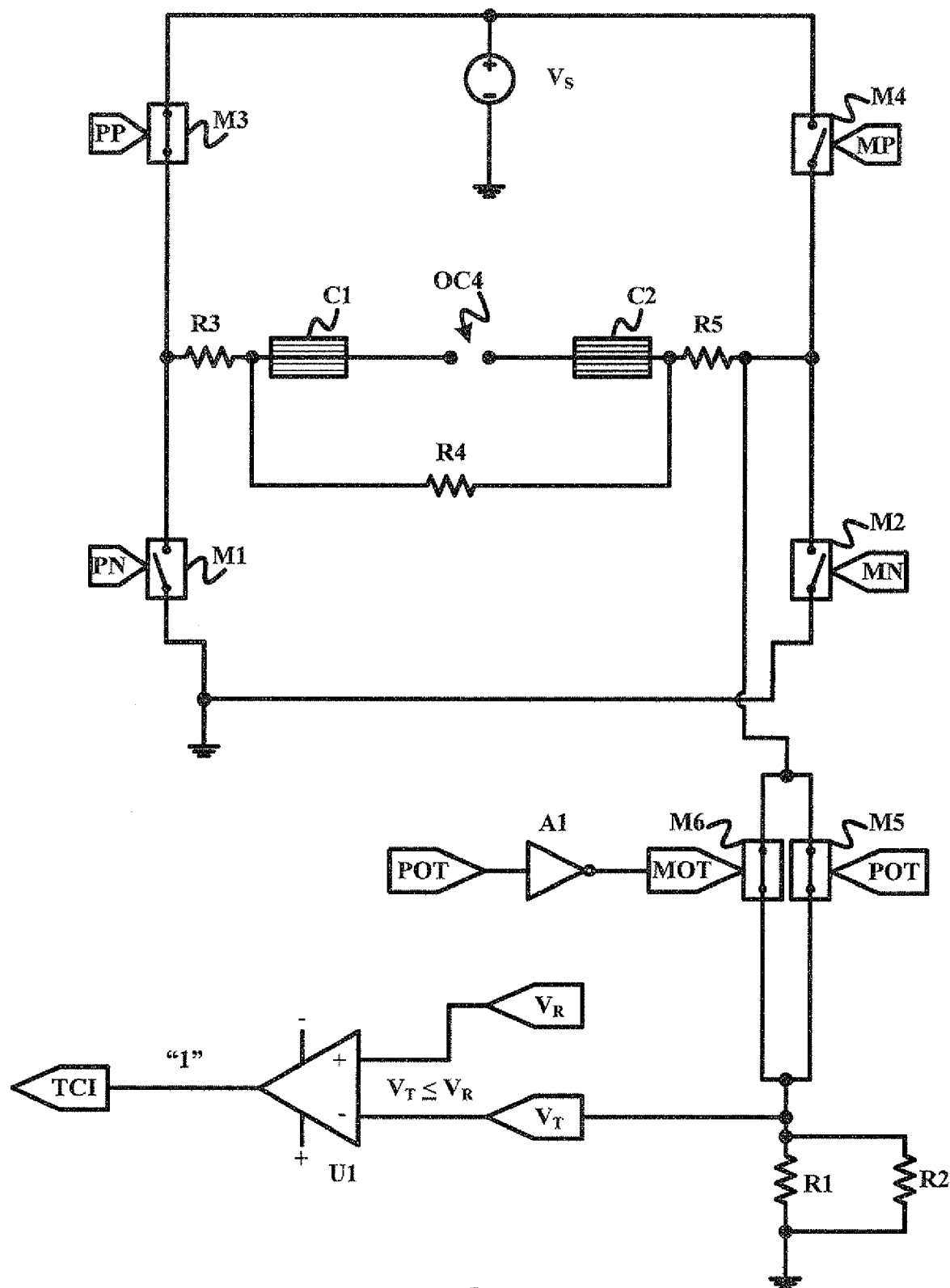

The test mode of the storage drive encompasses FETs M3, M5 and M6 being in a conductive state ("COND ST") and FETs M1, M2 and M4 being in a non-conductive state whereby write current driver circuit 50 and test current sensor 70 are electrically connected to write head 30 as shown in FIGS. 16 and 17. This is accomplished by an application of an enable logic level of gate signals PP, POT and MOT to the respective gates of FETs M3, M5 and M6, and by an application of a disable logic level of gate signals PN, MN and MP to the respective gates of FETs M1, M2 and M4.

Figure 18:
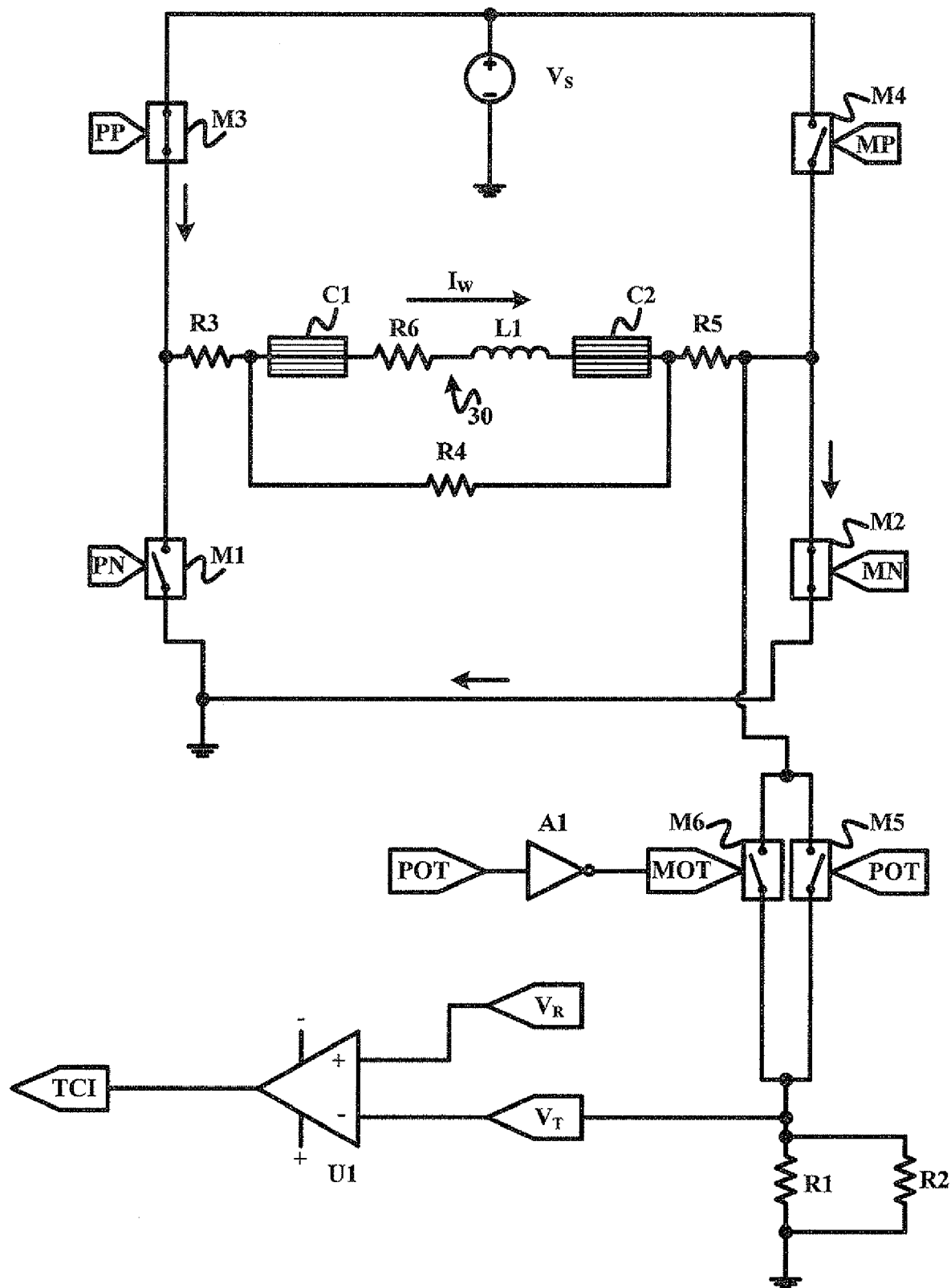
Figure 19:
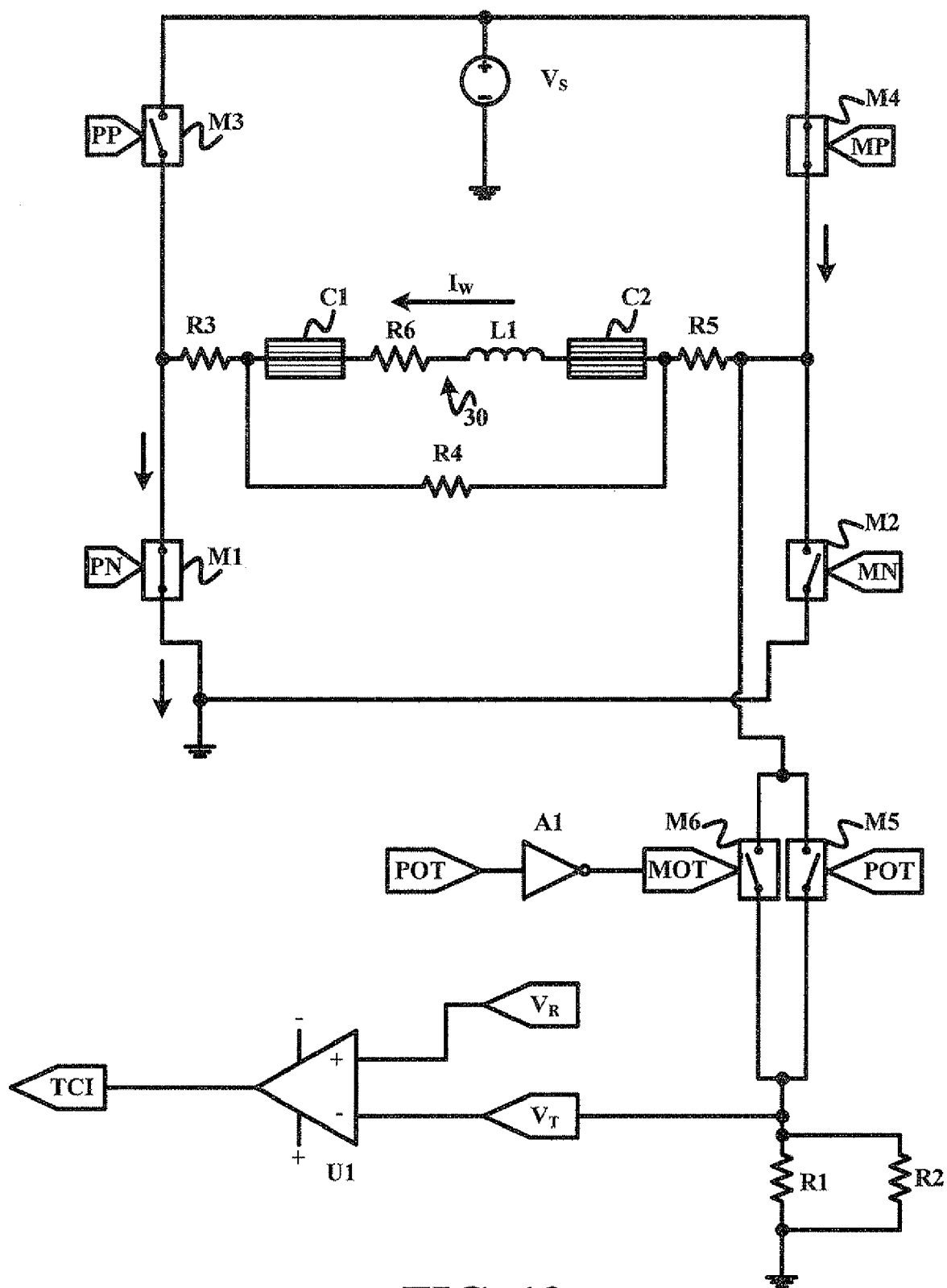

The write mode of the storage drive includes FETs M5 and M6 being in a non-conductive state with FETs M1 and M4 being in a non-conductive state and FETs M2 and M3 being in a conductive state as shown in FIG. 18, or with FETs M1 and M4 being in a conductive state and FETs M2 and M3 being in a non-conductive state as shown in FIG. 19. This is accomplished by an application of a disable logic level of gate signals POT and MOT to the respective gates of FETs M5 and M6 with either an application of a disable logic level of gate signals PN and MP to the respective gates of FETs M1 and M4 and an application of enable logic level of gate signals PP and MN to the respective gates of FETs M2 and M4, or with an application of an enable logic level of gate signals PN and MP to the respective gates of FETs M1 and M4 and an application of a disable logic level of gate signals PP and MN to the respective gates of FETs M2 and M3.

For the test mode, a flowchart 110 shown in FIG. 14 is representative of an open write condition detection method of the present invention. Specifically, a stage S112 of flowchart 110 encompasses a controller (not shown) providing the gate signals to FETs M1-M6 to transition FETs M3, M5 and M6 to a conductive state and to maintain FETs M1, M2 and M4 in a non-conductive state as shown in FIGS. 16 and 17. During a stage S114 of flowchart 110, test voltage $V_T$ is indicative of a degree of flow of a test current $I_T$ through write head 30, and compares test voltage $V_T$ to a reference voltage $V_R$, which is representative of a flow of write current $I_W$ through write head 30 under normal write conditions. If the comparison of test voltage $V_T$ and reference voltage $V_R$ indicates the flow of test current $I_T$ through write head 30 is equivalent to the flow of write current $I_W$ through write head 30 under a normal write condition (i.e., test current $I_T \approx$ write current $I_W$), then voltage comparator U1 generates test current indicator TCI as a test current pass indicator of a logic low level ("0") as shown in FIG. 16 that is communicated to the controller for purposes of informing the controller of the normal write condition of the storage drive. As a result, the controller understands that it can operate the storage drive in the write mode as shown in FIGS. 18 and 19.

Conversely, if the comparison of test voltage $V_T$ and reference voltage $V_R$ indicates the flow of test current $I_T$ through write bead 30 is unequivalent to the flow of write current $I_W$ through write head 30 under a normal write condition (i.e., test current $I_T$=0 or is significantly less than write current $I_W$), then voltage comparator U1 generates test current indicator TCI as a test current failure indicator of a logic low level ("1") as shown in FIG. 17 that is communicated to the controller for purposes of informing the controller of the open write condition of the storage drive. As a result, the controller understands that it can not operate the storage drive in the write mode as shown in FIGS. 18 and 19.

Referring to FIGS. 12 and 15-19, resistors R1-R6 and inductor L1 may be chosen to optimize the circuit depending on the desired write current and write frequency of the application. Typical values for the embodiment herein described are as follows. The write clock cycle frequency is in the range of 120-350 MHz. Voltage source $V_S$ is programmable in the range of 3-6 volts in order to change the magnitude of write current $I_W$ and test current $I_T$ by as much as 40-50%. Resistors R1 and R2 have a resistance of 200Ω, resistors R3 and R5 have a resistance of 100Ω, resistor R4 has a resistance of 255Ω, resistor R6 has a resistance of 25Ω, and inductor L1 has an inductance of 150 nanohenries. As such, reference voltage $V_R$ is in the range of 0.4 to 0.8 volts, preferably 0.6 volts.

Figure 20:
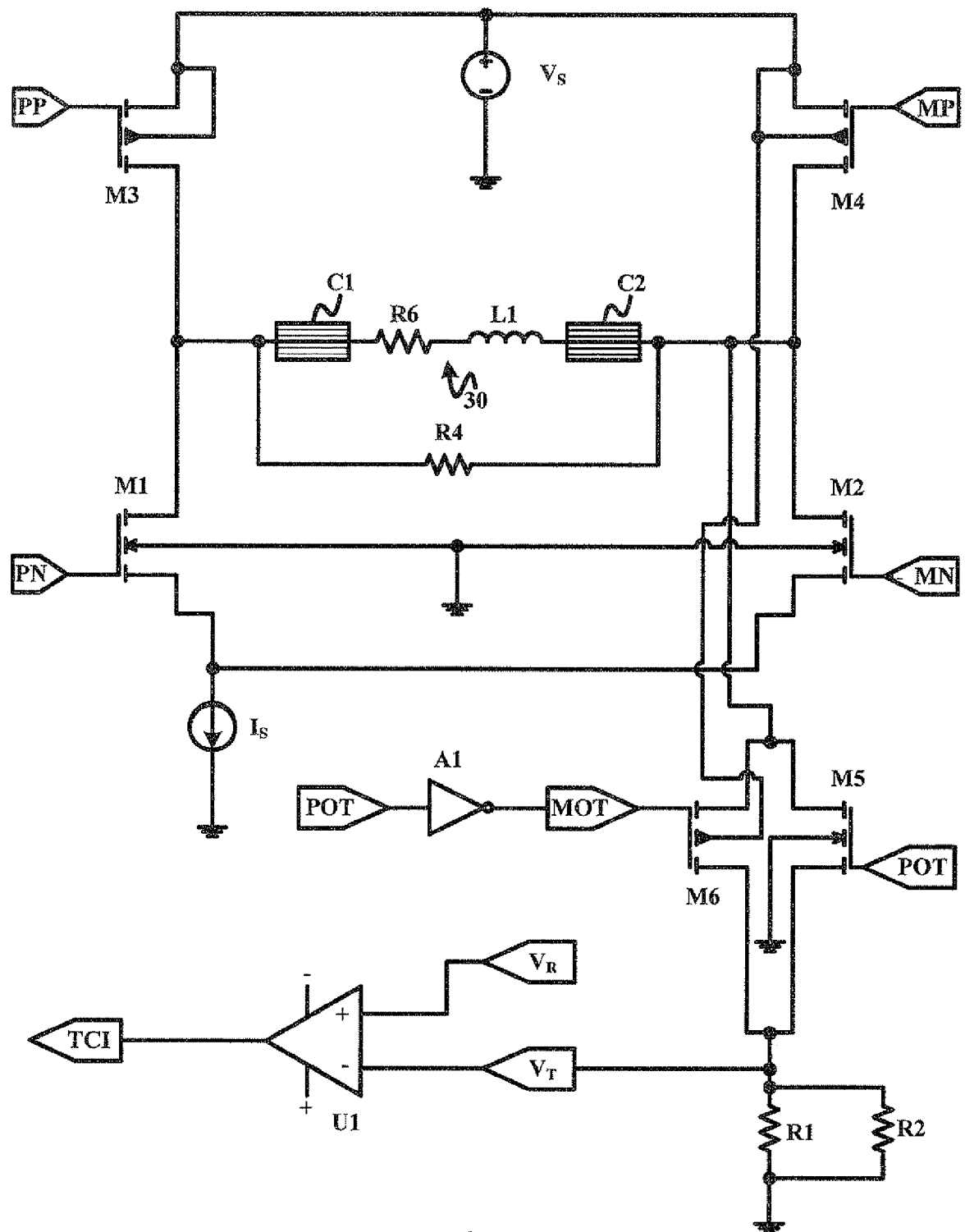
FIG. 20 illustrates a schematic diagram of one embodiment of a H configuration current mode write current driver circuit having an integrated open write condition detector accordance with the present invention.

FIG. 20 illustrates a current mode H configuration write current driver circuit that is similar to the voltage mode H configuration write current driver circuit shown in FIG. 12 with the exceptions of (1) an elimination of resistors R3 and R5, and (2) source electrodes of NFETs M1 and M2 being connected to a current source $I_S$ instead of ground. Current source $I_S$ may be programmable in a typical range of 10 to 50 milliamps in order to change the magnitude of write current $I_W$.

Figure 21:
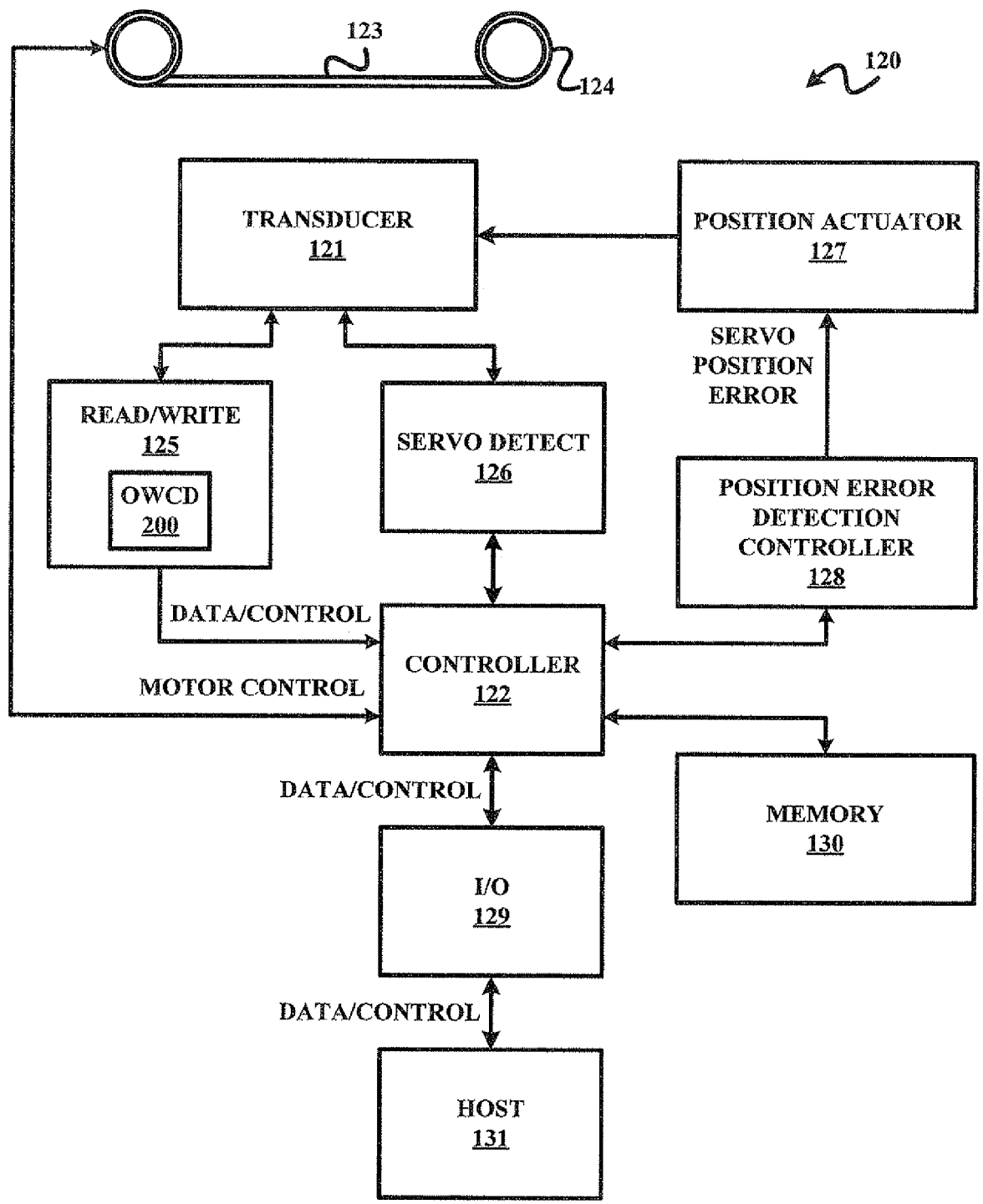
FIG. 21 illustrates a block diagram of one embodiment of a magnetic tape recorder system in accordance with the present invention.

FIG. 21 illustrates an embodiment of a magnetic tape recorder or tape drive system 120 incorporating an open write condition detector ("OWCD") 200 of the present invention. A tape drive controller 122 provides a motor control signal to rotate tape reels 124 and move magnetic tape 123 across the read/write transducer head 121. Read/write channel 125 transmits read/write signals between the read/write transducer 121 and the controller 122. The data is communicated through I/O channel 129 with host 131. Lateral positioning of the transducer 121 with respect to the tape 123 is accomplished by positioning actuator 127. The lateral repositioning is required to access the various tracks of the tape 123 with the transducer 121. A servo system may be employed for accurate lateral repositioning of the transducer 121. An exemplary servo system includes a servo detector 126 to detect both the track that the head is currently on and whether the head is off center. Controller 122 indicates the track address of a desired new track to position error detection controller 128 for repositioning the head. Servo detector 126 indicates the current track to position error detection controller 128, and the controller provides a servo position error signal to positioning actuator 127 which repositions the transducer 121 to the new track. The servo system also provides track following signals to positioning actuator 127 so that the tracks on tape 123 may be closely spaced. Controller 122 uses logic control signals at Power on Reset to activate detector 200 whereby, upon a detection of an open write condition, controller 122 will report a RAS error to thereby flag a need for drive 200 to be serviced or replaced.

Referring to FIGS. 5-20, those having ordinary skill in the art will appreciate numerous benefits and advantages of the illustrated embodiments of the present invention including, but not limited to, an efficient and effective technique for detecting an open write condition of a storage drive. Those having ordinary skill in the art will further appreciate how to implement the inventive principles of the present invention to driver circuits more or less complex than the driver circuits illustrated throughout FIGS. 5-20.

Those having ordinary skill in the art may develop other embodiments of the present invention in view of the inventive principles of the present invention described herein. The terms and expression which have been employed in the foregoing specification are used herein as terms of description and not of limitations, and there is no intention in the use of such terms and expressions of excluding equivalents of the features shown and described or segments thereof; it being recognized that the scope of the invention is defined and limited only by the claims which follow.

We claim:

1. In a storage drive including a write head, a write current driver circuit and a test current sensor, a method for operating a storage drive between a plurality of operational modes, the method comprising:

for a test mode of the storage drive, electrically connecting a write current driver circuit and a test current sensor to the write head, wherein the test current sensor generates a sense signal indicative of a degree of a flow of a test current through the write head; and for a write mode of the storage drive, electrically connecting the write current driver circuit to the write head and electrically disconnecting the test current sensor from the write head, wherein the write head records data on a magnetic media based on a flow of a write current through the write head.

2. The method of claim 1, wherein for the test mode of the storage drive, the test current sensor compares the sense signal to a reference signal representative of the flow of the write current through the write head, and the test current sensor generates a test current pass indicator based on the comparison of the sense signal and the reference signal indicating a normal write head condition representative of the degree of flow of the test current through the write head being equivalent to the flow of the write current through the write head.

3. The method of claim 2, wherein the test current sensor generates the test current pass indicator as a function of the sense signal being greater than the reference signal.

4. The method of claim 1, wherein for the test mode of the storage drive,
the test current sensor compares the sense signal to a reference signal representative of the flow of the write current through the write head, and
the test current sensor generates a test current failure indicator based on the comparison of the sense signal and the reference signal indicating an open write head condition representative of the degree of flow of the test current through the write head being unequivalent to the flow of the write current through the write head.

5. The method of claim 4, wherein the test current sensor generates the test current failure indicator as a function of the sense signal being less than the reference signal.

6. A storage drive having a plurality of operational modes, the storage drive comprising:
a write head;
a write current driver circuit;
a test current sensor;
for a test mode of the storage drive, the write current driver circuit and the test current sensor are electrically connected to the write head, wherein the test current sensor generates a sense signal indicative of a degree of a flow of a test current through the write head as a function of the write current; and
for a write mode of the storage drive, the write current driver circuit is electrically connected to the write head and the test current sensor is electrically disconnected from the write head, wherein the write head records data on a magnetic media based on a flow of a write current through the write head.

7. The storage drive of claim 6, wherein for the test mode of the storage drive,
the test current sensor compares the sense signal to a reference signal representative of the flow of the write current through the write head, and
the test current sensor generates a test current pass indicator based on the comparison of the sense signal and the reference signal indicating a normal write head condition representative of the degree of flow of the test current through the write head being equivalent to the flow of the write current through the write head.

8. The storage drive of claim 7, wherein the test current sensor generates the test current pass indicator as a function of the sense signal being greater than the reference signal.

9. The storage drive of claim 6, wherein for the test mode of the storage drive,
the test current sensor compares the sense signal to a reference signal representative of the flow of the write current through the write head, and
the test current sensor generates a test current failure indicator based on the comparison of the sense signal and the reference signal indicating an open write head condition representative of the degree of flow of the test current through the write head being unequivalent to the flow of the write current through the write head.

10. The storage drive of claim 9, wherein the test current sensor generates the test current failure indicator as a function of the sense signal being less than the reference signal.

11. The storage drive of claim 6, wherein for the test mode of the storage drive, the test current sensor includes:
a voltage generator;
at least one test current driver electrically connecting the voltage generator to the write head, wherein the voltage generator generates the sense signal in the form of a test voltage representative of the degree of the flow of the test current through the write head; and
a voltage comparator comparing the test voltage to a reference voltage representative of the flow of the write current through the write head.

12. The storage drive of claim 11,
wherein the voltage comparator generates a test current pass indicator as a function of the test voltage being greater than the reference voltage; and
wherein the voltage comparator generates a test current failure indicator as a function of the test voltage being less than the reference voltage.

13. The storage drive of claim 6, wherein the write current driver circuit is a voltage mode write current driver circuit.

14. The storage drive of claim 6, wherein the write current driver circuit is a current mode write current driver circuit.

15. A storage system having a plurality of operational modes, the storage system comprising:
a controller;
a write head;
a write current driver circuit;
a test current sensor;
for a test mode of the storage system, the controller electrically connecting the write current driver circuit and the test current sensor to the write head, wherein the test current sensor generates a sense signal indicative of a degree of a flow of a test current through the write head; and
for a write mode of the storage system, the controller electrically connecting the write current driver circuit to the write head and electrically disconnecting the test current sensor from the write head, wherein the write head records data on a magnetic media based on a flow of a write current through the write head.

16. The storage system of claim 15,
wherein the test current sensor compares the sense signal to a reference signal representative of the flow of the write current through the write head; and
wherein the test current sensor communicates a test current pass indicator to the controller based on the comparison of the sense signal and the reference signal indicating a normal write head condition representative of the degree of flow of the test current through the write head being equivalent to the flow of the write current through the write head.

17. The storage system of claim 16, wherein the test current sensor generates the test current pass indicator as a function of the sense signal being greater than the reference signal.

18. The storage system of claim 15,
wherein the test current sensor compares the sense signal to a reference signal representative of the flow of the write current through the write head; and
wherein the test current sensor communicates a test current failure indicator based on the comparison of the sense signal and the reference signal indicating an open write head condition representative of the degree of flow of the test current through the write head being unequivalent to the flow of the write current through the write head.

19. The storage system of claim 18, wherein the test current sensor generates the test current failure indicator as a function of the sense signal being less than the reference signal.

20. The storage system of claim 15, wherein for the test mode of the storage drive, the test current sensor includes:
   a voltage generator;
   at least one test current driver electrically connecting the voltage generator to the write head, wherein the voltage generator generates the sense signal in the form of a test voltage representative of the degree of the flow of the test current through the write head; and
   a voltage comparator comparing the test voltage to a reference voltage representative of the flow of the write current through the write head.

21. The storage drive of claim 20,
   wherein the voltage comparator communicates a test current pass indicator to the controller as a function of the test voltage being greater than the reference voltage; and
   wherein the voltage comparator communicates a test current failure indicator to the controller as a function of the test voltage being less than the reference voltage.

22. The storage system of claim 15 wherein the write current driver circuit is a voltage mode write current driver circuit.

23. The storage system of claim 15, wherein the write current driver circuit is a current mode write current driver circuit.

* * * * *